US006768397B2

(12) United States Patent
Takamine

(10) Patent No.: US 6,768,397 B2
(45) Date of Patent: Jul. 27, 2004

(54) SURFACE ACOUSTIC WAVE FILTER WITH BALANCED AND UNBALANCED TERMINALS

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/991,450

(22) Filed: Nov. 20, 2001

(65) Prior Publication Data

US 2002/0063612 A1 May 30, 2002

(30) Foreign Application Priority Data

Nov. 29, 2000 (JP) ........................................ 2000-363316

(51) Int. Cl.[7] .............................. H03H 9/64; H03H 9/72
(52) U.S. Cl. ....................... 333/193; 333/195; 333/133; 310/313 B; 310/313 D
(58) Field of Search ................................ 333/193–196, 333/133; 310/313 R, 313 B, 313 C, 313 D

(56) References Cited

U.S. PATENT DOCUMENTS

| | | | | |
|---|---|---|---|---|
| 5,568,002 A | * | 10/1996 | Kawakatsu et al. | ...... 310/313 B |
| 5,790,000 A | * | 8/1998 | Dai et al. | ................... 333/193 |
| 5,835,990 A | * | 11/1998 | Saw et al. | .............. 310/313 D |
| 6,111,481 A | * | 8/2000 | Ueda et al. | ................. 333/194 |
| 6,255,915 B1 | * | 7/2001 | Edmonson | .................. 333/193 |
| 6,268,782 B1 | * | 7/2001 | Hartmann et al. | .......... 333/193 |
| 6,420,946 B1 | * | 7/2002 | Bauer et al. | ................ 333/193 |

FOREIGN PATENT DOCUMENTS

| | | | |
|---|---|---|---|
| EP | 0 605 884 A1 | | 7/1994 |
| EP | 0 800 270 | * | 10/1997 |
| JP | 6-177697 A | | 6/1994 |
| JP | 8-265087 A | | 10/1996 |
| JP | 10-135780 A | | 5/1998 |
| JP | 11-97966 | * | 4/1999 |
| JP | 11-317642 A | | 11/1999 |
| JP | 2000-091883 A | | 3/2000 |
| JP | 2000-151337 | * | 5/2000 |
| JP | 2001-292050 | * | 10/2001 |
| JP | 2001-308672 | * | 11/2001 |
| JP | 2001-313540 | * | 11/2001 |
| WO | WO 00/25423 | * | 5/2000 |
| WO | WO 01/13514 A1 | | 2/2001 |

OTHER PUBLICATIONS

Yutaka Taguchi et al.: "A New Balanced–Unbalanced Type RF–Band SAW Filter"; 1996 IEEE MTT–S International Microwave Symposium Digest. San Francisco; Jun. 17–21, 1996, IEEE MTT–S International Microwave Symposium Digest, New York, IEEE, US; vol. 2, Jun. 17, 1996; pp. 417–420, XP000731919; ISBN: 0–7803–3247–4.

* cited by examiner

Primary Examiner—Barbara Summons
(74) Attorney, Agent, or Firm—Keating & Bennett, LLP

(57) ABSTRACT

A longitudinally-coupled resonator-type surface acoustic wave filter having a balanced-to-unbalanced conversion function, that improves the degree of balance outside the pass band, and allows the attenuation outside the pass band to be increased. In this surface acoustic wave filter, at least three IDTs are arranged along the propagation direction of a surface acoustic wave, and among the plurality of IDTs, the IDTs on opposite sides are disposed in an approximate point-symmetry about a central IDT. Thus, substantially equal parasitic impedances are added to first and second balanced signal terminals.

18 Claims, 7 Drawing Sheets

SURFACE ACOUSTIC WAVE FILTER WITH BALANCED AND UNBALANCED TERMINALS

BACKGROUND OF THE INVENTION

1. Field of the Invention

The present invention relates to a surface acoustic wave filter used as, for example, a band pass filter in a portable telephone, and more particularly, to a surface acoustic wave filter having a balanced-to-unbalanced conversion function, namely, a balun function.

2. Description of the Related Art

With the reduction in size and weight of portable telephones in recent years, the number and size of components included in portable telephones have been greatly reduced. In addition, components combining a plurality of functions are being developed.

Accordingly, surface acoustic filters used for the RF(radio frequency) stage of portable telephones, having a balanced-to-unbalanced conversion function, namely, a balun function, have been developed, and are primarily used in GSM portable telephones.

FIG. 11 is a schematic plan view showing the electrode structure of a conventional surface acoustic wave filter 100 having a balanced-to-unbalanced conversion function.

In the surface acoustic wave filter 100, first to third IDTs (interdigital transducers) 101 to 103 are arranged on a piezoelectric substrate (not shown) along the propagation direction of a surface acoustic wave. Reflectors 104 and 105 are provided on the opposite sides of the IDTs 101 to 103 in the direction of a surface acoustic wave.

One end of each of the IDTs 101 and 103 is electrically connected to an unbalanced signal terminal 108, and the other end of each IDT 101 and 103 is connected to the ground potential. One end of the IDT 102 is electrically connected to a first balanced signal terminal 106, and the other end thereof is electrically connected to a second balanced signal terminal 107.

The magnitude of the attenuation outside the pass band of a surface acoustic wave filter having a balanced-to-unbalanced conversion function depends upon the degree of balance of the surface acoustic wave filter. The degree of balance is represented as the difference between the transmission characteristic between the unbalanced signal terminal and the first balanced signal terminal, and the transmission characteristic between the unbalanced signal terminal and the second balanced signal terminal. Of these differences in the transmission characteristic, the difference in the amplitude characteristic is called "amplitude balance degree" and the difference in the phase characteristic is called "phase balance degree".

When a surface acoustic filter having a balanced-to-unbalanced conversion function is defined by a device having first to third ports, and, for example, the unbalanced input terminal thereof is the first port, and the first and second balanced output terminals thereof are the second and third ports, respectively, the amplitude balance degree and the phase balance degree are represented by the following expressions:

Amplitude balance degree=$|A|$, $A=|20 \cdot \log(S21)|-|20 \cdot \log(S31)|$, and Phase balance degree=$|B-180|$, $B=|\angle S21-\angle S31|$ Here, S21 denotes the transmission coefficient from the first port to the second port, and S31 denotes the transmission coefficient from the first port to the third port.

Optimal values of the amplitude-balance degree and the phase balance degree in the outside of the pass band of the filter are 0 dB for the amplitude balance degree, and 0° for the phase balance degree. The magnitude of the attenuation outside the pass band in the filter having these optimal degrees of balance is infinity. Therefore, as the amplitude balance degree and the phase balance degree approach 0 dB and 0 degrees, respectively, the attenuation outside the pass band is greatly increased.

In the surface acoustic wave filter 100 shown in FIG. 11, although a balanced-to-unbalanced conversion function can be achieved, the degree of balance is unsatisfactory, and thus, the attenuation outside the pass band is insufficient.

SUMMARY OF THE INVENTION

To overcome the above-described problems and drawbacks, preferred embodiments of the present invention provide a longitudinally-coupled resonator-type surface acoustic wave filter that improves the degree of balance outside the pass band in addition to having a balanced-to-unbalanced conversion function, and that greatly increases the attenuation outside the pass band.

A surface acoustic wave filter according to a first preferred embodiment of the present invention includes a piezoelectric substrate, a plurality of IDTs provided on the piezoelectric substrate and arranged along the propagation direction of a surface acoustic wave, and a balanced-to-unbalanced conversion function. Among the plurality of IDTs, the IDTs on opposite sides are disposed in an approximate point-symmetry arrangement relative to the IDT positioned at the approximate center in the propagation direction of a surface acoustic wave.

A surface acoustic wave filter according to a second preferred embodiment of the present invention includes a piezoelectric substrate, first to third IDTs provided on the piezoelectric substrate, and sequentially arranged along the propagation direction of a surface acoustic wave, an unbalanced signal terminal connected to the first and third IDTs, and first and second balanced signal terminals each connected to the opposite ends of the second IDT. In this surface acoustic wave filter, the first to third IDTs have first and second end portions located on opposite sides thereof in a direction that is substantially perpendicular to the propagation direction of a surface acoustic wave, the first end portion of the first IDT and the second end portion of the third IDT are each electrically connected to the unbalanced signal terminal, and the second end portion of the first IDT and the first end portion of the third IDT are each connected to the ground potential.

A surface acoustic wave filter according to a third preferred embodiment of the present invention includes a piezoelectric substrate, first to third IDTs provided on the piezoelectric substrate and sequentially arranged along the propagation direction of a surface acoustic wave, an unbalanced signal terminal connected to the second IDT, and first and second balanced signal terminals connected to the first and third IDT. In this surface acoustic wave filter, the first to third IDTs have first and second end portions located on opposite sides thereof in a direction that is substantially perpendicular to the propagation direction of a surface acoustic wave, the first end portion of the first IDT and the second end portion of the third IDT are each electrically connected to a first balanced signal terminal, and the second end portion of the first IDT and the first end portion of the third IDT are each electrically connected to a second balanced signal terminal.

In the above-described conventional surface acoustic wave filter 100, since the degree of balance outside the pass band is unsatisfactory, the attenuation outside the pass band is insufficient. The reason for this is as follows. Since the balanced signal terminal 106 is surrounded by the signal line connected to the unbalanced signal terminal 108, a parasitic capacitance inserted between input and output terminals in parallel has a large influence, and, since the balanced signal terminal 107 is adjacent to the wiring connected to the ground terminal, a parasitic capacitance added between the signal line and the ground line in parallel has a large influence. That is, the parasitic capacitances added to the balanced signal terminals 106 and 107 differ from each other, and thereby the degree of balance outside the pass band is unsatisfactory.

Due to the above-described problems, the present inventor found that, if an electrode is provided such that substantially equal parasitic impedances are each added to a pair of balanced signal terminals, the degree of balance outside the pass band is greatly improved, and the attenuation outside the pass band will greatly increase. On the basis of this discovery, the present invention was developed.

Accordingly, the surface acoustic wave filter in accordance with preferred embodiments of the present invention includes an electrode structure such that substantially equal parasitic impedances are each added to the first and second balanced signal terminals.

More specifically, in the first preferred embodiment of the present invention, among the plurality of IDTs, the opposite IDTs are disposed in approximate point-symmetry about the IDT positioned at the approximate center in the propagation direction of a surface acoustic wave, and thereby, the substantially equal parasitic impedances are added to the first and second balanced signal terminals.

In the second preferred embodiment of the present invention, the first end portion of the first IDT and the second end portion of the third IDT are each connected to the unbalanced signal terminals, and the second end portion of the first IDT and the first end portion of the third IDT are connected to the ground potential, and thereby, substantially equal parasitic impedances are each added to the first and second balanced signal terminals.

In the third preferred embodiment of the present invention, the first end portion of the first IDT and the second end portion of the third IDT are each electrically connected to a first balanced signal terminal, and the second end portion of the first IDT and the first end portion of the third IDT are electrically connected to a second balanced signal terminal, and thereby substantially equal parasitic impedances are each added to the first and second balanced signal terminals.

In the surface acoustic wave filter in accordance with preferred embodiments of the present invention, it is preferable that the number of electrode fingers of the IDT electrically connected to the balanced signal terminal are an even number, and that the numbers of the electrode fingers electrically connected to the first and second balanced signal terminals connected to the IDT are equal, such that the degree of balance within the pass band is greatly improved, resulting in a greatly increased attenuation outside the pass band.

Furthermore, in the surface acoustic wave filter in accordance with preferred embodiments of the present invention, preferably, at least one IDT connected to a balanced signal terminal or an unbalanced signal terminal has a plurality of IDT portions divided in the direction that is substantially perpendicular to the propagation direction of a surface acoustic wave. In the IDT having the plurality of IDT portions divided in the direction that is substantially perpendicular to the propagation direction of a surface acoustic wave, since the impedance thereof is increased, a surface acoustic wave filter different input and output impedances is produced.

Moreover, in the surface acoustic wave filter in accordance with preferred embodiments of the present invention, preferably, at least one surface acoustic wave resonator connected to the above-described surface acoustic wave filter in series and/or parallel, is further included. Connecting at least one surface acoustic wave resonator to the surface acoustic wave filter in accordance with preferred embodiments of the present invention in series and/or parallel greatly enhances the attenuation in the vicinity of the pass bands.

The surface acoustic wave filter in accordance with preferred embodiments of the present invention is suitably used for, e.g., the band-pass filter for use in the RF stage of a portable telephone. Therefore, by using the surface acoustic wave filter in accordance with preferred embodiments of the present invention, a communication device provided with a band-pass filter which has a balanced-to-unbalanced conversion function and exhibits a large attenuation outside the pass band, and which is compact and superior in the frequency characteristic is provided.

The above and other elements, characteristics, features, and advantages of the present invention will become apparent from the following detailed description of preferred embodiments of the invention in conjunction with the accompanying drawings. Meanwhile, among these drawings, the drawings which show an electrode structure are depicted as having a fewer number of electrode fingers than in reality in order to simplify the drawings.

DETAILED DESCRIPTION OF PREFERRED EMBODIMENTS

Figure 1:
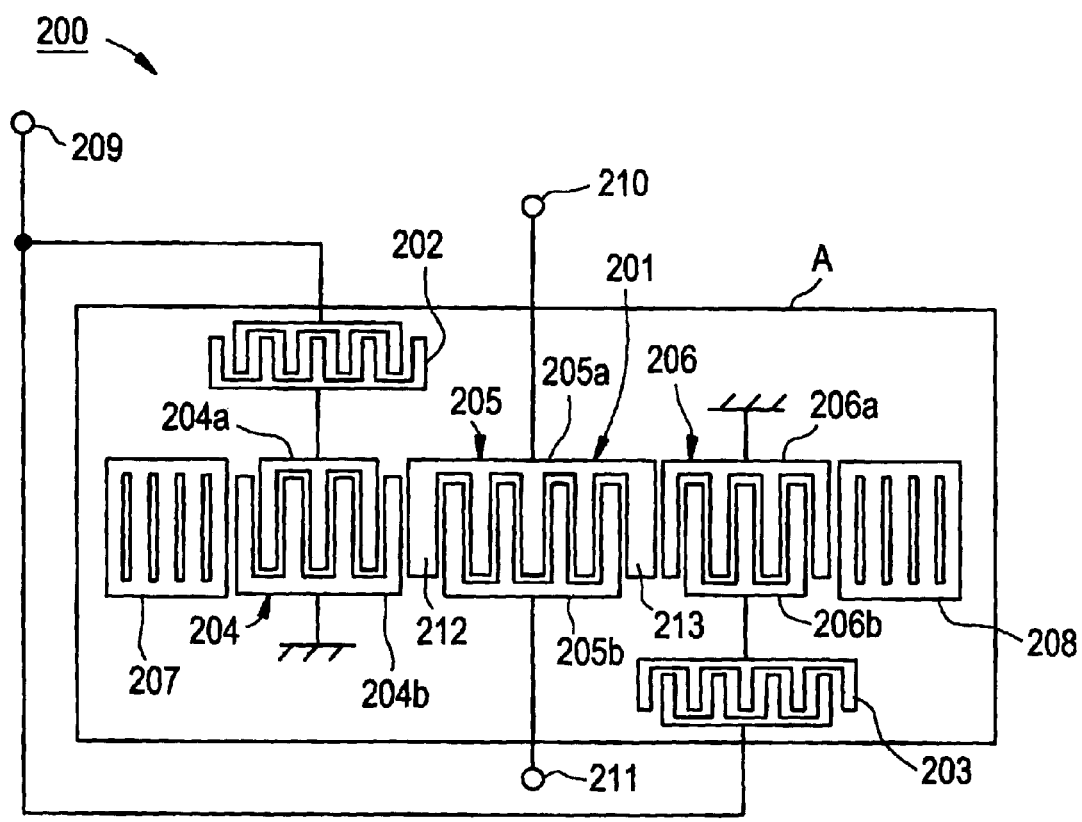
FIG. 1 is a schematic plan view showing a surface acoustic wave filter in accordance with a first preferred embodiment of the present invention.

FIG. 1 is a schematic plan view showing a surface acoustic wave filter 200 in accordance with a first preferred embodiment of the present invention.

The surface acoustic wave filter 200 in accordance with this preferred embodiment is configured to be a receiving filter used for the RF stage of a PCS portable telephone. However, other practical applications are possible for the filter of the present invention.

The surface acoustic wave filter 200 is constructed by providing an electrode structure shown in FIG. 1 on a piezoelectric substrate A of which the outline is schematically shown in FIG. 1. In this preferred embodiment, the piezoelectric substrate A is formed using a 40±5°, Y-cut, X-propagation $LiTaO_3$ substrate.

A longitudinally-coupled resonator-type surface acoustic wave filter 201 and surface acoustic wave resonators 202 and 203 are provided on the piezoelectric substrate A. The longitudinally-coupled resonator-type surface acoustic wave filter 201 includes first to third IDTs 204 to 206. Reflectors 207 and 208 are provided on opposite sides of the IDTs 204 to 206 in the propagation direction of a surface acoustic wave.

The electrode structure and the surface acoustic wave resonators 202 and 203 are preferably made of Al, or other suitable material.

Each of the IDTs 204 to 206 includes a pair of comb electrodes. Here, in the IDTs 204 to 206, the end portions on opposite sides in a direction that is substantially perpendicular to the direction of a surface acoustic wave are represented as first and second end portions 204a and 204b; 205a and 205b; and 206a and 206b, respectively. The end portions 204a to 206b correspond to the end portions of one-side comb electrodes of the IDTs 204 to 206, respectively.

The first end portion 204a of the IDT 204 is connected to an unbalanced signal terminal 209 via the surface acoustic wave resonator 202, and the second end portion 206b of the IDT 206 is connected to the unbalanced signal terminal 209 via the surface acoustic wave resonator 203. That is, the surface acoustic wave resonators 202 and 203 are each connected to longitudinally-coupled resonator-type surface acoustic wave filter 201 in series.

The second end portion 204b of the IDT 204 and the first end portion 206a of the IDT 206 are each connected to the ground electrode.

The first end portion 205a of the IDT 205 is connected to the first balanced signal terminal 210, and the second end portion 205b of the IDT 205 is connected to the second balanced signal terminal 211.

In the surface acoustic wave filter 200 according to this preferred embodiment, among the plurality of IDTs 204 to 206, the opposite IDTs are disposed in approximate point-symmetry about the IDT located at the approximate center, and the first end portion 204a of the IDT 204, and the second end portion 206b of the IDT 206 are connected to the unbalanced signal terminal 209 as described above, whereby the degree of balance outside the pass band is greatly improved, and the attenuation outside the pass band is greatly increased, as can be seen from the following experimental results.

The above-described surface acoustic wave filter 200 was constructed on the basis of the following design, and the frequency characteristic thereof was measured. electrode finger crossing width W of IDTs 204 to 206=78.7λI (here, $\mu$I is the wavelength of surface acoustic wave determined by the IDTs);

number of electrode fingers of each of the IDTs 204 to 206 . . . IDT 204: 25, IDT 205: 41, and IDT 206: 25;

wavelength in IDT, λI=2.03 $\mu$m;

wavelength in the reflectors 207 and 208, λR=2.05 $\mu$m;

number of electrode fingers of each of the reflectors=100;

IDT-to-IDT distance=0.77λI ("IDT-to-IDT distance" refers to the intercentral distance of electrode fingers connected to mutually different potentials, in IDTs adjacent to each other);

IDT-to-reflector distance=0.55λR ("IDT-to-reflector distance" refers to the electrode finger intercentral distance between an IDT and a reflector adjacent thereto);

duty ratio=0.60;

film thickness of electrode=0.08λI

As can be seen from FIG. 1, the electrode fingers 212 and 213 at opposite sides of the IDT 205 in the propagation direction of a surface acoustic wave are wider than the remaining electrode fingers, and thereby free surface portions in IDT-IDT distance areas are reduced.

The specifications of the surface acoustic wave resonators 202 and 203 are as follows:

crossing width W=17.3λ;

number of electrode fingers of IDTs=301 wavelength λ=2.02 $\mu$m;

number of electrode fingers of each of the reflectors=30 (however, in FIG. 1, the reflectors on the opposite sides of the IDTs are not shown)

IDT-to-reflector distance=0.50λ;

duty ratio=0.60;

film thickness of electrode=0.08λ

Figure 3:
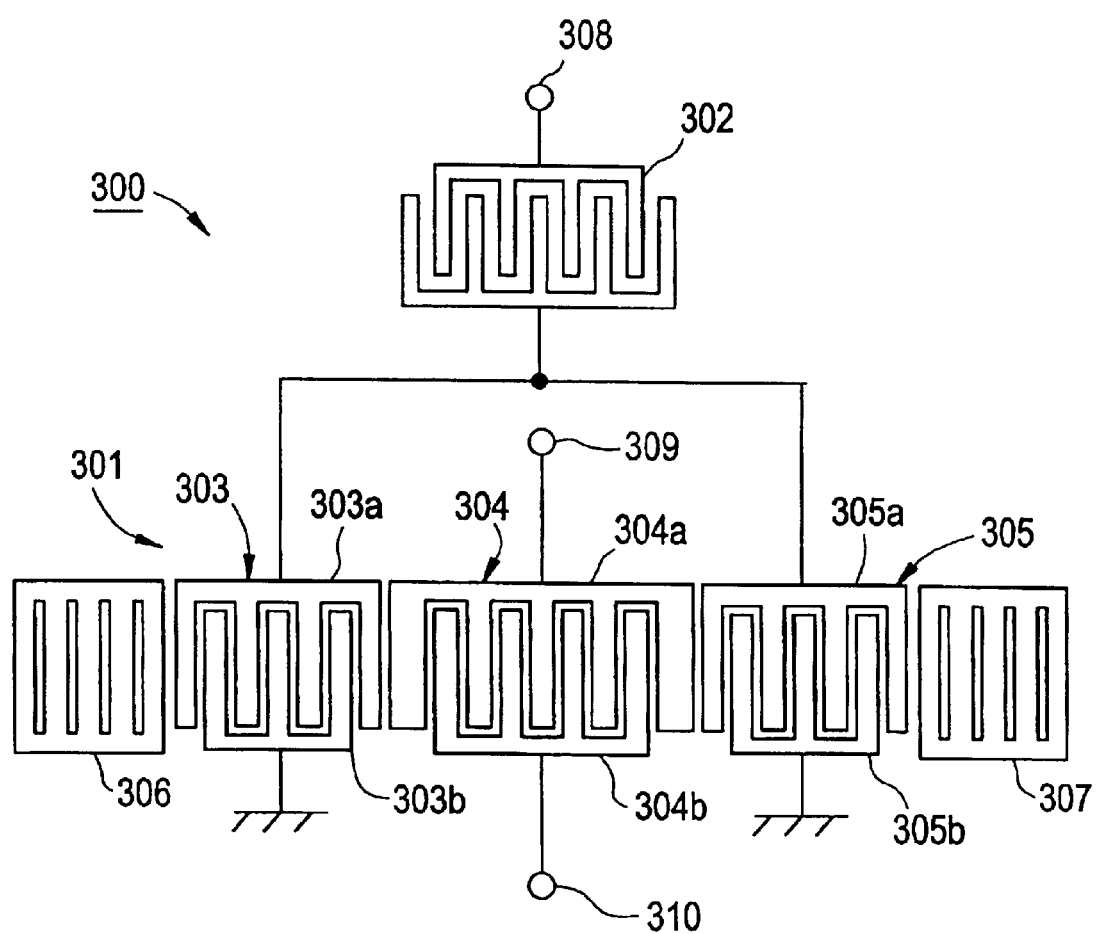
FIG. 3 is a schematic plan view showing the electrode structure of a conventional surface acoustic wave filter provided for comparison.

For comparison, a conventional surface acoustic wave filter 300, as shown in FIG. 3, was made of the same material as that of the above-described preferred embodiment, and the frequency characteristic thereof was measured. In the surface acoustic wave filter 300 shown in FIG. 3, a surface acoustic wave resonator 302 is connected to a longitudinally-coupled resonator-type surface acoustic wave filter 301 in series, and the longitudinally-coupled resonator-type surface acoustic wave filter 301 is connected to an unbalanced signal terminal 308 via the surface acoustic wave resonator 302. The longitudinally-coupled resonator-type surface acoustic wave filter 301 includes first to third IDTs 303 to 305, and reflectors 306 and 307. In the surface acoustic wave filter 300, the first end portions 303a and 305a of the respective IDTs 303 and 305 are connected to the unbalanced signal terminal 308 via the surface acoustic wave resonator 302, and the second end portions of 303b and 305b of the respective IDTs 303 and 305 are connected to the ground potential. The first and second end portions 304a and 304b of the second IDT 304 are connected to first and second balanced signal terminal 309 and 310, respectively.

That is, in the surface acoustic wave filter 300 shown in FIG. 3, the IDTs 303 and 305 are connected to the unbalanced signal terminal 308 via the first end portions 303a and 305a, respectively. Herein, the configurations of the longitudinally-coupled resonator-type surface acoustic wave filter 301 and the surface acoustic wave resonator 302 are fundamentally the same as those of the longitudinally-coupled resonator-type surface acoustic wave filter 201 and the surface acoustic wave resonators 202 and 203, respectively. However, to adjust the phase, the longitudinally-coupled resonator-type surface acoustic wave filter 301 is configured such that the posture of the IDT 303 thereof is opposite to that of the corresponding IDT 204 of the longitudinally-coupled resonator-type surface acoustic wave filter 201. Also, the surface acoustic wave resonator 302 is preferably constructed to have a crossing width that is about twice as large as that of the surface acoustic wave resonator 202 and 203.

Figure 2:
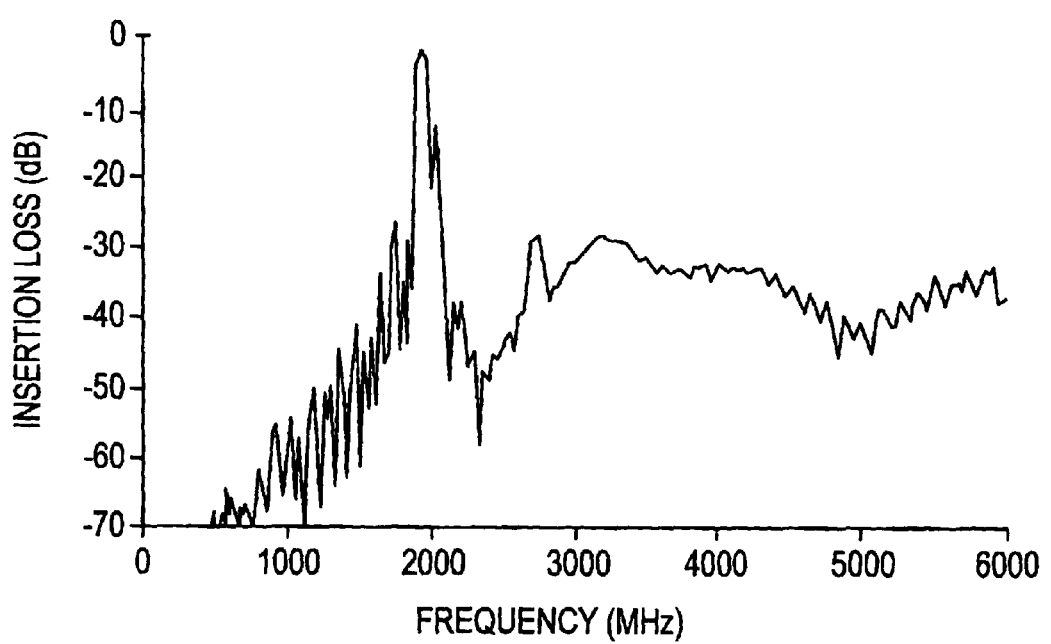
FIG. 2 is a diagram showing the attenuation-frequency characteristic of the surface acoustic wave filter in accordance with the first preferred embodiment of the present invention.
Figure 4:
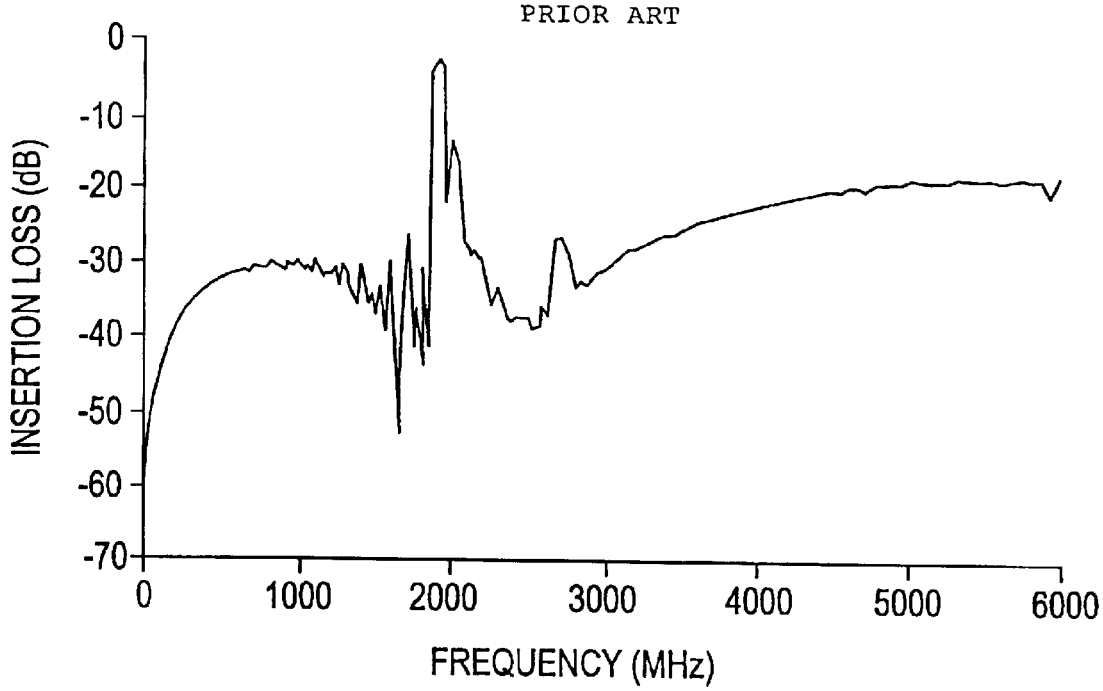
FIG. 4 is a diagram showing the attenuation-frequency characteristic of the conventional surface acoustic wave filter provided for comparison, which is shown in FIG. 3.

The frequency characteristic of the surface acoustic wave filter 200 in accordance with the above-described first preferred embodiment, and that of the conventional surface acoustic wave filter 300 prepared as described above, which is shown in FIG. 3, are illustrated in FIGS. 2 and 4, respectively.

As is evident from the comparison between FIGS. 2 and 4, the surface acoustic wave filter 200 according to the first preferred embodiment produces greatly increased attenuation outside the pass band. For example, when comparing the attenuations of the first preferred embodiment and the conventional example at 0 to 1 GHz, the conventional example exhibits an attenuation of 30 dB, whereas the first preferred embodiment exhibits an attenuation of 55 dB. That is, the attenuation of the first preferred embodiment is improved by 25 dB over the conventional example. Then when comparing the attenuations of the first preferred embodiment and the conventional example at 4 to 6 GHz, the conventional example exhibits an attenuation of 18 dB, whereas the first preferred embodiment exhibits an attenuation of 32 dB. That is, the attenuation of the first preferred embodiment is improved by 14 dB over the conventional example.

The reason why the attenuation outside the pass band could be greatly improved in this preferred embodiment is described below.

As described above, in the conventional surface acoustic wave filter having a balanced-to-unbalanced conversion function, the first balanced signal terminal 309 is adjacent to the signal line, and the second balanced signal terminal 310 is adjacent to the ground line. Therefore, the influences of the parasitic impedance on the balanced signal terminals 309 and 310 are significantly different, such that the degree of balance outside the pass band is greatly reduced, and the attenuation outside the pass band is insufficient.

In contrast, in this preferred embodiment, in which the IDTs 204 and 206 are connected to the unbalanced signal 209, such that mutually opposite ends of the IDTs 204 and 206, i.e., the first end portion 204a and the second end portion 206b are connected to the unbalanced signal terminal 209. Therefore, both balanced signal terminals 210 and 211 are adjacent to both the signal line and the ground line, and thereby the influences of parasitic impedance to the balanced signal terminals 210 and 211 are substantially equal to each other. In other words, since the IDTs 204 and 206 on opposite sides are disposed in an approximate point-symmetry about the center IDT 205, the influences of parasitic impedance on the first and second balanced signal terminals 210 and 211 are substantially equal to each other. Consequently, the degree of balance outside the pass band is greatly improved, and the attenuation outside the pass band is greatly increased.

Figure 5:
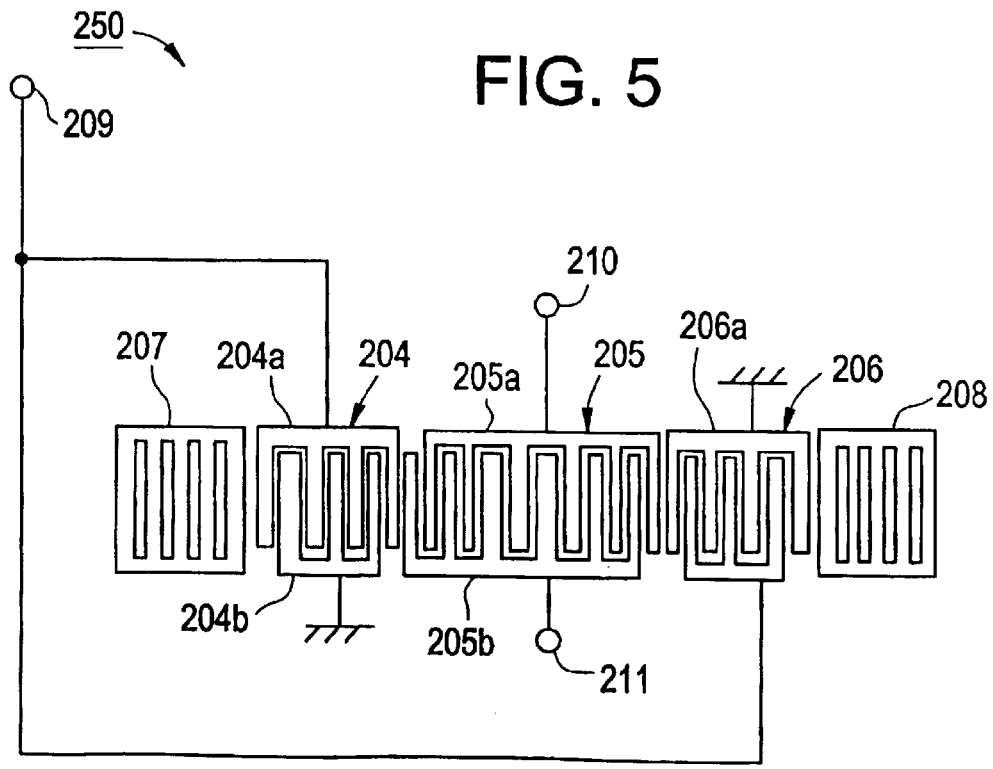
FIG. 5 is a schematic plan view explaining a surface acoustic wave filter in accordance with a modification of the first preferred embodiment of the present invention.

Further, in this preferred embodiment, the number of electrode fingers of the IDT 205 connected to the balanced signal terminals 210 and 211 is preferably an odd number, but it is desirable that, like a longitudinally-coupled resonator-type surface acoustic wave filter 250 in accordance with a modification shown in FIG. 5, the number of electrode fingers of the second IDT 205 positioned at the approximate center in the propagation direction and connected to the balanced signal terminals 210 and 211, be an even number. In this case, since the number of electrode fingers connected to the balanced signal terminals 210 and 211 are equal to each other, the degree of balance within the pass band is further improved, and the attenuation outside the pass band is further increased.

The above-described longitudinally-coupled resonator-type surface acoustic wave filter 250 is constructed in the same manner as the first preferred embodiment, except that the number of the electrode fingers of the IDT 205 thereof is different from that of the first preferred embodiment, and that narrow-pitch electrode fingers are provided on opposite sides of the gaps between the IDTs 204 and 205, and between the IDTs 205 and 206. Therefore, in a configuration having narrow-pitch electrode fingers, the effect of the present invention is achieved, as in the case of the first preferred embodiment.

Figure 6:
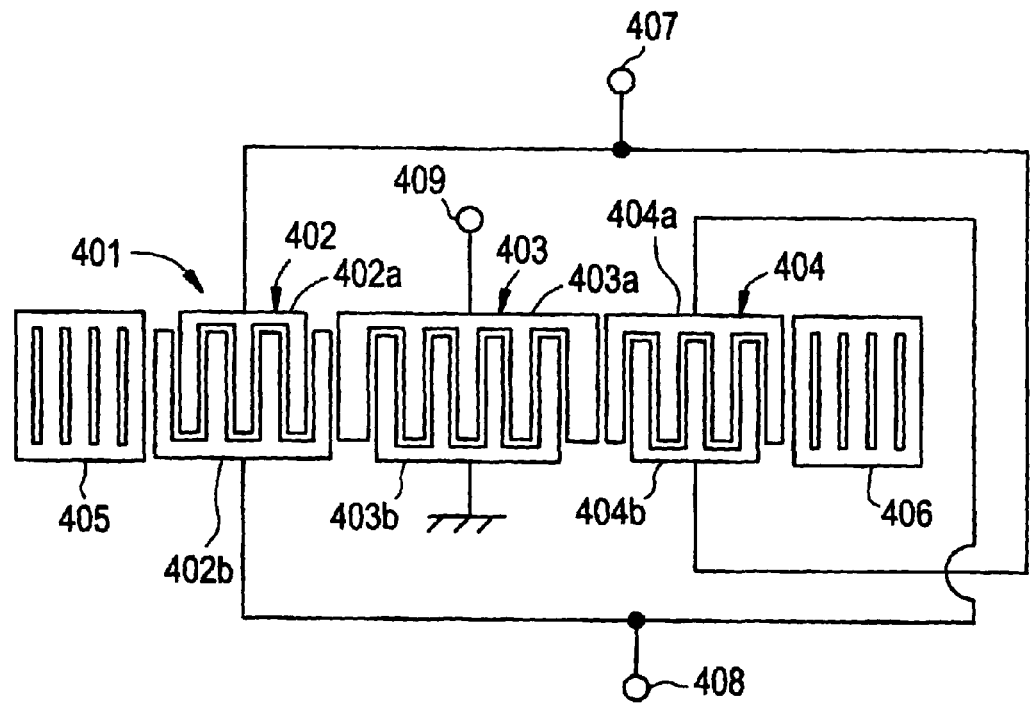
FIG. 6 is a schematic plan view showing the electrode structure of a longitudinally-coupled resonator-type surface acoustic wave filter in accordance with a second preferred embodiment of the present invention.

FIG. 6 is a schematic plan view showing the electrode structure of a surface acoustic wave filter according to a second preferred embodiment of the present invention. As in the first preferred embodiment, an electrode structure shown in the figure is formed on a piezoelectric substrate constituted of a 40±50°, Y-cut, X-propagation LiTaO$_3$ substrate.

A longitudinally-coupled resonator-type surface acoustic wave filter 401 is formed of an Al electrode.

The longitudinally-coupled resonator-type surface acoustic wave filter 401 includes first to third IDTs 402 to 404 sequentially arranged along the propagation direction of a surface acoustic wave, and reflectors 405 and 406 disposed on opposite sides of the IDTs 402 to 404 are provided, in the direction of a surface acoustic wave.

In this preferred embodiment, first end portions of the first to third IDTs 402 to 404 in the direction that is substantially perpendicular to the propagation direction of a surface acoustic wave are represented as first end portions 402a, 403a, and 404a, and second end portions are represented as the second end portions 402b, 403b, and 404b.

The first end portion 403a of the second IDT 403 is electrically connected to an unbalanced signal terminal 409, and the second end portion 403b thereof is connected to the ground potential.

The first end portion 402a of the first IDT 402 and the second end portion 404b of the third IDT 404 are electrically connected to an first balanced signal terminal 407. The second end portion 402b of the IDT 402 and the first end portion 404a of the IDT 404 are electrically connected to an second balanced signal terminal 408.

In the IDTs 402 and 404 connected to the balanced signal terminals according to the second preferred embodiment, the first end portion 402a of the first IDT 402 and the second end portion 404b of the third IDT 404 are electrically connected to the first balanced signal terminal 407, and the second end portion 402b of the IDT 402 and the first end portion 404a of the IDT 404 are electrically connected to the second balanced signal terminal 408. As in the case of the first embodiment, therefore, the second preferred embodiment is configured such that the IDTs 402 and 404 are disposed in an approximate point-symmetry about the central IDT 403.

In the IDT 402, therefore, the end portion 402a adjacent to the signal line connecting the unbalanced signal terminal 409 and the IDT 403, is connected to the balanced signal terminal 407, and the end portion 402b adjacent to the ground line is connected to the balanced signal terminal 408. Conversely, in the IDT 404, the end portion 404a adjacent to the signal line is connected to the balanced signal terminal 408, and the end portion 404b adjacent to the ground line is connected to the balanced signal terminal 407. Therefore, as in the first preferred embodiment, the influences of parasitic impedance on the first and second the balanced signal terminal 407 and 408 are substantially equal to each other. Thereby, in the second preferred embodiment, the degree of balance outside the pass band is greatly improved, and the attenuation outside the pass band is greatly enhanced, as in the first preferred embodiment of the present invention.

Figure 7:
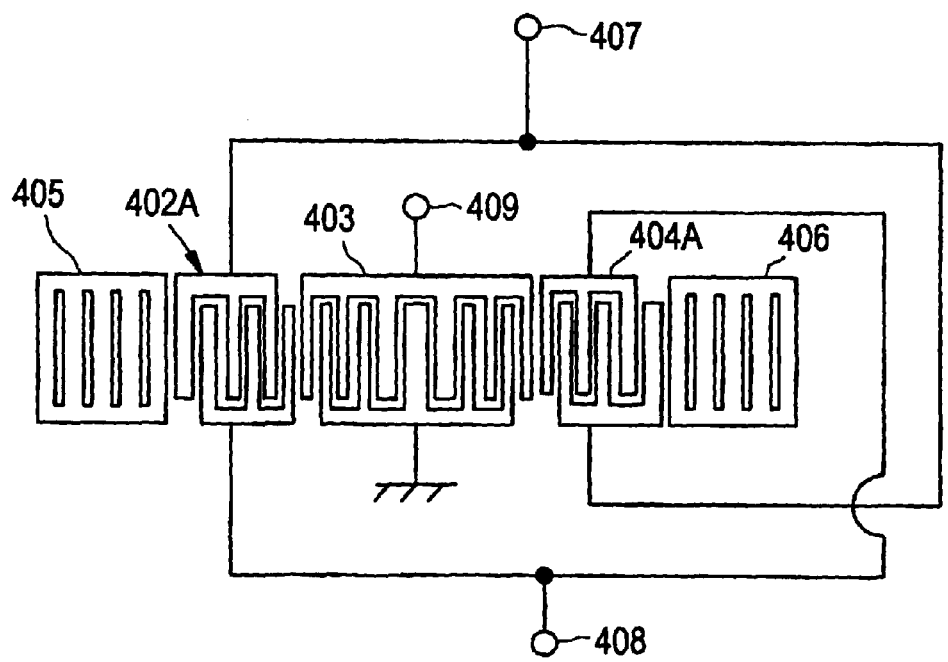
FIG. 7 is a schematic plan view showing a modification of the longitudinally-coupled resonator-type surface acoustic wave filter in accordance with the second preferred embodiment of the present invention.

In the second preferred embodiment, the number of electrode fingers of each of the IDTs 402 and 404 is preferably an odd number, but as schematically shown in FIG. 7, by setting the number of the electrode fingers of the IDTs 402A and 404A connected to the balanced signal terminals 407 and 408 to be an even number, the numbers of the electrode fingers connected to the balanced signal terminals 407 and 408 are equal to each other. Therefore, the degree of balance within the pass band is further improved, thus, further increasing attenuation outside the pass band.

Figure 8:
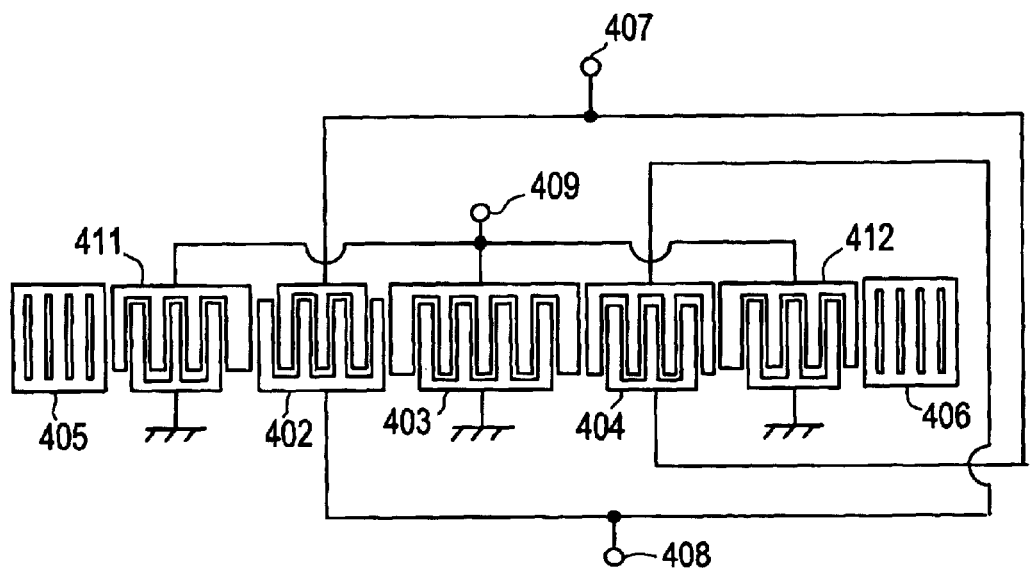
FIG. 8 is a schematic plan view showing another modification of the longitudinally-coupled resonator-type surface acoustic wave filter in accordance with the second preferred embodiment of the present invention.

Meanwhile, in the longitudinally-coupled resonator-type surface acoustic wave filter shown in FIG. 6, the first to third IDTs 402 to 404 are provided, that is, a three-IDT type surface acoustic wave filter is provided. However, as shown in FIG. 8, the present invention can also be applied to a five-IDT type longitudinally-coupled resonator-type surface acoustic wave filter which includes additional IDTs 411 and 412 on opposite sides of the three IDTs. Furthermore, the present invention can also be applied to a longitudinally-coupled resonator-type surface acoustic wave filter having more IDTs.

Figure 9:
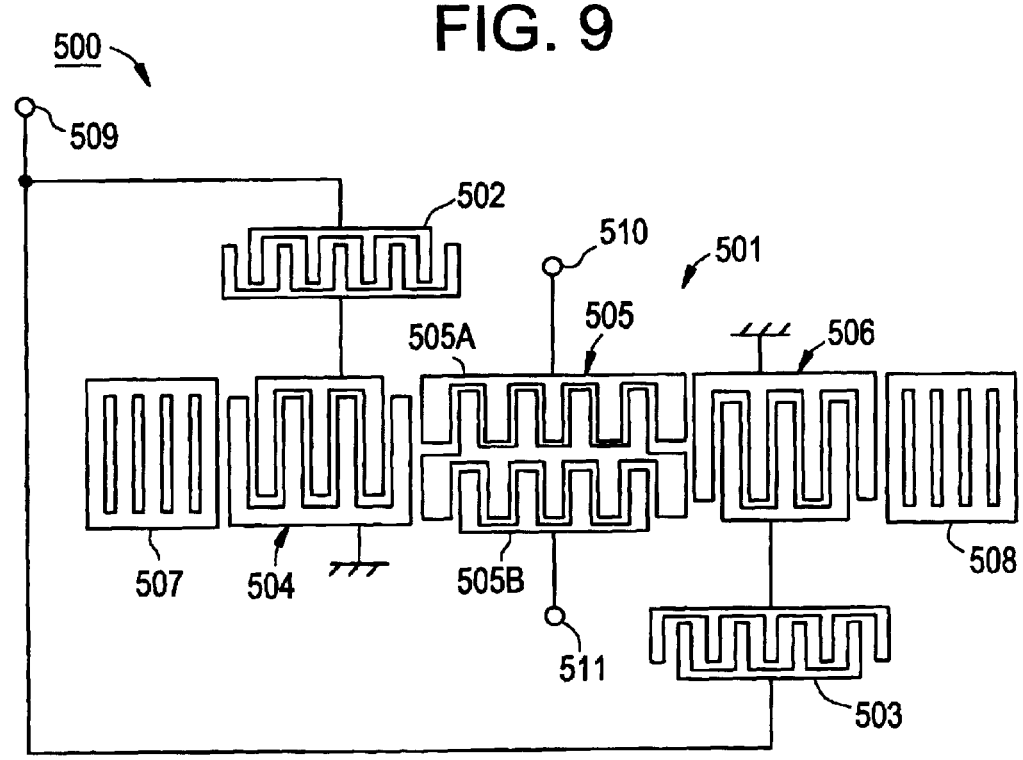
FIG. 9 is a schematic plan view showing a surface acoustic wave filter in accordance with a third preferred embodiment of the present invention.

FIG. 9 is a schematic plan view showing a surface acoustic wave filter 500 according to a third preferred embodiment of the present invention. As in the first and second preferred embodiments, the surface acoustic wave filter 500 is constructed by providing an electrode structure shown in the figure on a piezoelectric substrate constituted of a 40±5°, Y-cut, X-propagation LiTaO$_3$ substrate.

Specifically, a longitudinally-coupled resonator-type surface acoustic wave filter 501, and surface acoustic wave resonators 502 and 503 connected in series thereto are made of an Al electrode.

The surface acoustic wave filter 500 in accordance with the third preferred embodiment is constructed fundamentally in the same manner as the surface acoustic wave filter 200 in accordance with the first preferred embodiment. The surface acoustic wave filter 500 is different from the first preferred embodiment in that, in the longitudinally-coupled resonator-type surface acoustic wave filter 501, the second IDT 505 at the approximate center includes a plurality of IDT portions 505A and 505B divided along a direction that is substantially perpendicular to the propagation direction of a surface acoustic wave. In other respects, the surface acoustic wave filter 500 is the same as the first preferred embodiment. Therefore, corresponding portions between the surface acoustic wave filter 500 and the first preferred embodiment are given the same reference numerals, and the description about the first preferred embodiment will be utilized here.

In the same manner as the third preferred embodiment, by dividing the second IDT 505 at the approximate center into the first and second IDT portions 505A and 505B, the input impedance and the output impedance differ by a factor of four. That is, since the IDT 505 is divided in two as described above, the impedances on the balanced signal terminals 510 and 511 sides are increased. Thereby, a surface acoustic wave filter is provided wherein the input and the output impedances thereof are different from each other, the degree of balance outside the pass band is greatly improved, and the attenuation outside the pass band is greatly enhanced.

In the third preferred embodiment, the IDT 505 is divided into two portions, and the impedances on the balanced signal terminal sides are increased. Conversely, however, by dividing the IDTs 504 and 506 connected to the unbalanced signal terminal 509, the impedance on the unbalanced signal terminal side may be increased instead.

Figure 10:
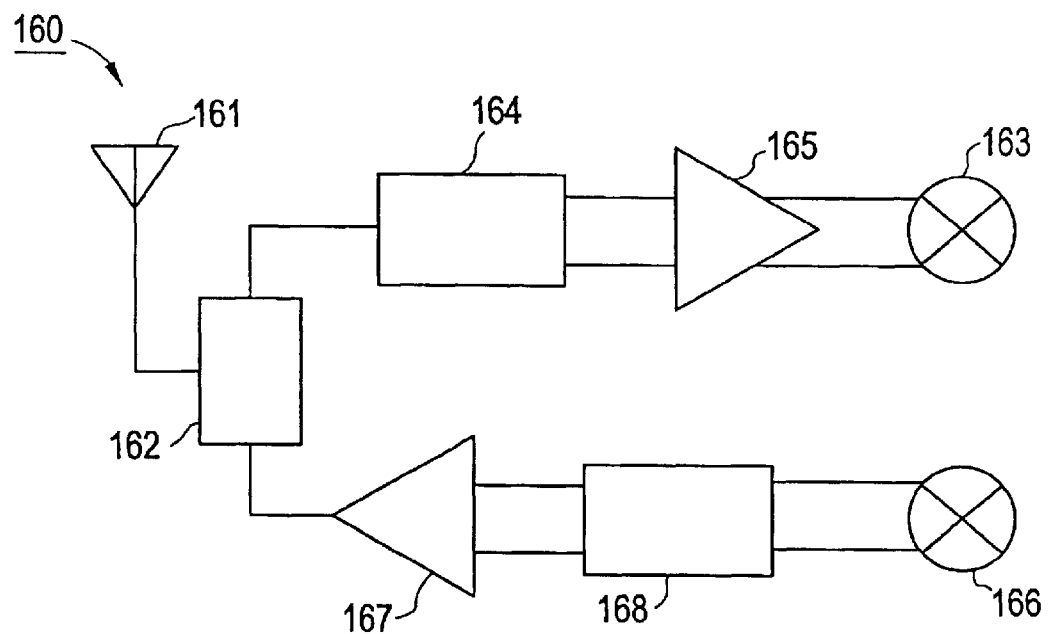
FIG. 10 is a schematic block diagram showing a communication device constructed using the surface acoustic wave filter in accordance with the present invention.
Figure 11:
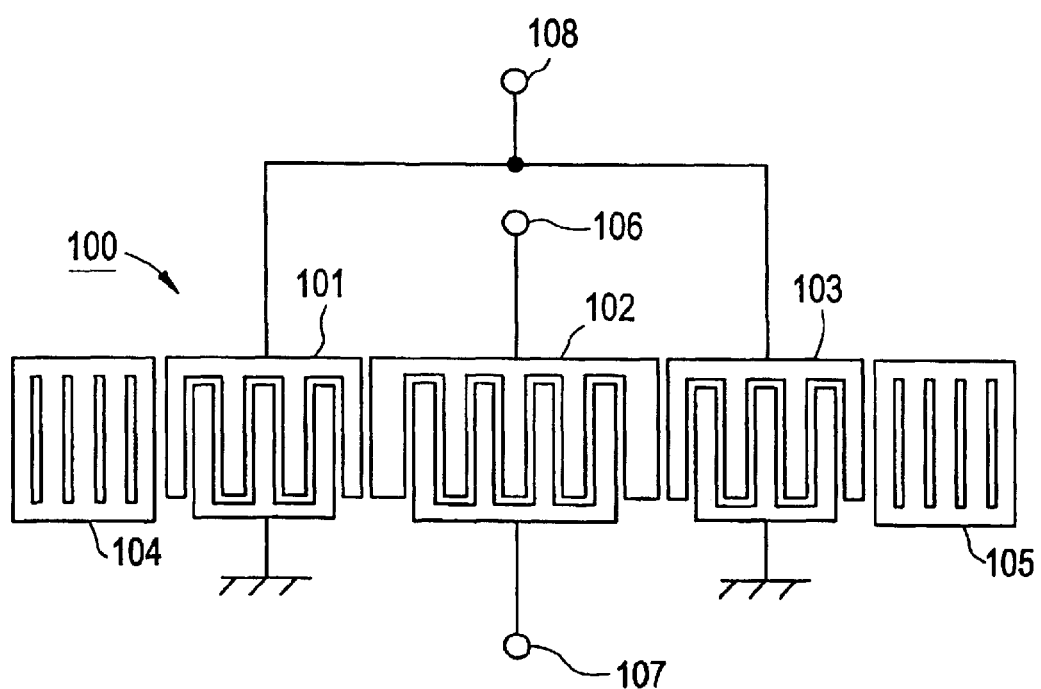
FIG. 11 is a schematic plan view showing a conventional surface acoustic wave filter.

FIG. 10 is a schematic block diagram explaining a communication device 160 constructed including the surface acoustic wave device in accordance with preferred embodiments of the present invention.

In FIG. 10, a duplexer 162 is connected to an antenna 161. A surface acoustic wave filter 164 and an amplifier 165 are connected between the duplexer 162 and an receiving-side mixer 163. An amplifier 167 and a surface acoustic wave filter 168 are connected between the duplexer 162 and a transmitting-side mixer 166. When the amplifier 165 and the mixer 166 are thus adaptable to balanced signals, the surface acoustic wave devices constructed in accordance with preferred embodiments of the present invention are suitably used as the above-described surface acoustic wave filters 164 and 168.

In preferred embodiments of the present invention, not only a 40±5°, Y-cut, X-propagation LiTaO$_3$ substrate, but various piezoelectric substrates may be used for the piezoelectric substrate. For example, a 64° to 72°, Y-cut, X-propagation LiNbO$_3$ substrate, a 41°, Y-cut, X-propagation LiNbO$_3$ substrate, or piezoelectric ceramic substrate may be used. Moreover, a substrate wherein a piezoelectric thin film is provided on an insulating substrate may also be used.

In the surface acoustic wave filter in accordance with preferred embodiments of the present invention, the surface acoustic wave resonator may be connected to the surface acoustic wave filter in any of the series and/or parallel connection modes, and the number of the surface acoustic wave resonator to be connected is not particularly limited.

As is evident from the foregoing, in the surface acoustic wave filter in accordance with preferred embodiments of the present invention, substantially equal parasitic impedances are added to the first and second balanced signal terminals, thereby greatly improving the degree of balance outside the pass band. This produces a surface acoustic wave filter having a balanced-to-unbalanced conversion function, and exhibiting greatly increased attenuation outside the pass band.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. A surface acoustic wave filter, comprising:
   a piezoelectric substrate;
   a plurality of IDTs provided on said piezoelectric substrate and arranged along a propagation direction of a surface acoustic wave;

first and second balanced signal terminals connected to at least one of the plurality of IDTs;

an unbalanced signal terminal connected to at least one of the plurality of IDTs; and at least two of said plurality of IDTs located on opposite sides of an IDT of said plurality of IDTs located at a central portion in the propagation direction of the surface acoustic wave device being disposed in an approximate point-symmetry about the IDT located at the central portion in the propagation direction of a surface acoustic wave; wherein at least one of the IDTs has at least one finger electrode having a width that is different from a width of at least another finger electrode of the at least one of the IDTs; and at least one of the plurality of IDTs includes a plurality of IDT portions divided along a direction that is substantially perpendicular to the propagation direction of a surface acoustic wave.

2. A surface acoustic wave filter in accordance with claim 1, wherein the at least one of the plurality of IDTs electrically connected to said first and second balanced signal terminals has an even number of electrode fingers.

3. A communication device having the surface acoustic wave filter in accordance with claim 1.

4. A surface acoustic wave filter in accordance with claim 1, further comprising at least one surface acoustic wave resonator connected to said surface acoustic wave filter in at least one of series and parallel.

5. A surface acoustic wave filter in accordance with claim 1, further comprising reflectors provided at end portions of said piezoelectric substrate.

6. A surface acoustic wave filter, comprising:

a piezoelectric substrate;

a plurality of IDTs provided on said piezoelectric substrate and arranged along a propagation direction of a surface acoustic wave;

first and second balanced signal terminals connected to at least one of the plurality of IDTs;

an unbalanced signal terminal connected to at least one of the plurality of IDTs; and at least two of said plurality of IDTs located on opposite sides of an IDT of said plurality of IDTs located at a central portion along the propagation direction of the surface acoustic wave device, each of said at least two IDTs having the unbalanced signal terminal and a ground line, the unbalanced signal terminal and the ground line of said at least two IDTs being disposed in an approximate point-symmetry about the IDT located at the central portion in the propagation direction of a surface acoustic wave.

7. A surface acoustic wave filter, comprising:

a piezoelectric substrate;

first, second and third IDTs provided on said piezoelectric substrate, and sequentially arranged along a propagation direction of a surface acoustic wave;

an unbalanced signal terminal connected to the first and third IDTs; and first and second balanced signal terminals each connected to opposite ends of the second IDT; wherein the unbalanced signal terminal is connected to a first end portion of the first IDT and to a first end portion of the third IDT opposing the first end portion of the first IDT along a direction substantially perpendicular to a propagation of a surface acoustic wave; and a ground potential is connected to a second end portion of the first IDT opposing the first end portion of the first IDT along the direction substantially perpendicular to the propagation of the surface acoustic wave and is connected to a second end portion of the third IDT opposing the first end portion of the third IDT along the direction substantially perpendicular to the propagation of the surface acoustic wave.

8. A surface acoustic wave filter in accordance with claim 7, wherein the IDT electrically connected to said balanced signal terminals has an even number of electrode fingers.

9. A surface acoustic wave filter in accordance with claim 7, wherein at least one IDT includes a plurality of IDT portions divided along the direction substantially perpendicular to the propagation direction of a surface acoustic wave.

10. A surface acoustic wave filter in accordance with claim 7, further comprising at least one surface acoustic wave resonator connected to said surface acoustic wave filter in at least one of series and parallel.

11. A surface acoustic wave filter in accordance with claim 7, further comprising reflectors provided at end portions of said piezoelectric substrate.

12. A communication device having the surface acoustic wave filter in accordance with claim 7.

13. A surface acoustic wave filter, comprising:

a piezoelectric substrate;

first, second and third IDTs provided on said piezoelectric substrate, and sequentially arranged along the propagation direction of a surface acoustic wave;

an unbalanced signal terminal connected to the second IDT; and first and second balanced signal terminals each connected to the first and third IDT; wherein the first balanced signal terminal is connected to a first end portion of the first IDT and to a first end portion of the third IDT opposing the first end portion of the first IDT along a direction substantially perpendicular to a propagation of a surface acoustic wave; and the second balanced signal terminal is connected to a second end portion of the first IDT opposing the first end portion of the first IDT along a direction substantially perpendicular to a propagation of a surface acoustic wave and a second end portion of the third IDT opposing the first end portion of the third IDT along a direction substantially perpendicular to a propagation of a surface acoustic wave.

14. A surface acoustic wave filter in accordance with claim 13, wherein the IDT electrically connected to said balanced signal terminals has an even number of electrode fingers.

15. A surface acoustic wave filter in accordance with claim 13, wherein at least one IDT includes a plurality of IDT portions divided along the direction that is substantially perpendicular to the propagation direction of a surface acoustic wave.

16. A surface acoustic wave filter in accordance with claim 13, further comprising at least one surface acoustic wave resonator connected to said surface acoustic wave filter in at least one of series and parallel.

17. A surface acoustic wave filter in accordance with claim 13, further comprising reflectors provided at end portions of said piezoelectric substrate.

18. A communication device having the surface acoustic wave filter in accordance with claim 13.

* * * * *